(12) United States Patent
Hall et al.

(10) Patent No.: US 7,180,011 B1
(45) Date of Patent: Feb. 20, 2007

(54) DEVICE FOR MINIMIZING DIFFERENTIAL PAIR LENGTH MISMATCH AND IMPEDANCE DISCONTINUITIES IN AN INTEGRATED CIRCUIT PACKAGE DESIGN

(75) Inventors: Jeffrey Hall, San Jose, CA (US); Shawn Nikoukary, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/276,938

(22) Filed: Mar. 17, 2006

(51) Int. Cl.
*H01R 13/46* (2006.01)
*H01R 12/04* (2006.01)
*H05K 5/00* (2006.01)

(52) U.S. Cl. .................. 174/520; 174/261; 174/255; 257/776; 257/774

(58) Field of Classification Search .............. 174/520, 174/261, 255, 251, 257; 257/774, 776
See application file for complete search history.

(56) References Cited

U.S. PATENT DOCUMENTS

| | | | | |
|---|---|---|---|---|
| 5,663,870 A | * | 9/1997 | Kerndlmaier | ............... 361/763 |
| 5,742,009 A | * | 4/1998 | Hamzehdoost et al. | ..... 174/260 |
| 6,235,997 B1 | * | 5/2001 | Asada et al. | ................. 174/260 |
| 6,680,544 B2 | * | 1/2004 | Lu et al. | ...................... 257/786 |
| 6,700,457 B2 | * | 3/2004 | McCall et al. | ................. 333/33 |
| 7,078,812 B2 | * | 7/2006 | Frank et al. | ................. 257/758 |

\* cited by examiner

*Primary Examiner*—Hung V. Ngo
(74) *Attorney, Agent, or Firm*—Eric James Whitesell

(57) ABSTRACT

A method of routing an integrated circuit package design includes steps of receiving as input at least a portion of an integrated circuit design including a differential pair of two electrical conductors, calculating a value of length mismatch between the two electrical conductors, calculating an added trace length to compensate for an impedance discontinuity of a shorter one of the two electrical conductors, and extending the shorter one of the two electrical conductors by routing the added trace length entirely inside an area surrounded by a contact pad that electrically terminates the shorter one of the two electrical conductors. The routing for the differential pair with the added trace length is generated as output in the integrated circuit design.

3 Claims, 7 Drawing Sheets

900

| Amount of Added Capacitance Due to Ball Pad | 0.27pF |
|---|---|

| Length of Trace Over Ball Pad (mm) | Amount of Added Inductance Due to Trace Over Ball Pad (nH) |
|---|---|
| 0.00003 | 0.020916737 |
| 0.00004 | 0.050903549 |
| 0.00005 | 0.085943791 |
| 0.00006 | 0.125011136 |
| 0.00007 | 0.167427421 |
| 0.00008 | 0.212710647 |
| 0.00009 | 0.260500424 |
| 0.0001 | 0.310517019 |
| 0.00011 | 0.36253696 |
| 0.00012 | 0.416377596 |
| 0.00013 | 0.471886833 |
| 0.00014 | 0.528936052 |
| 0.00015 | 0.58741506 |
| 0.00016 | 0.647228391 |
| 0.00017 | 0.708292537 |
| 0.00018 | 0.770533833 |
| 0.00019 | 0.833886812 |
| 0.0002 | 0.898292909 |

*FIG. 9*

DEVICE FOR MINIMIZING DIFFERENTIAL PAIR LENGTH MISMATCH AND IMPEDANCE DISCONTINUITIES IN AN INTEGRATED CIRCUIT PACKAGE DESIGN

BACKGROUND OF THE INVENTION

1. Field of the Invention

The present invention is directed to the design and manufacture of integrated circuits. More specifically, but without limitation thereto, the present invention is directed to a method of matching differential pair conductors in an integrated circuit design.

2. Description of Related Art

In integrated circuit package design, signals are frequently transmitted over a differential pair, that is, two conductors that each carry a signal having the same waveform but opposite polarity to that carried by the other conductor. Due to the routing of the differential pair in a typical integrated circuit package, one of the two conductors typically has a length slightly different than that of the other, which may result in distortion of the transmitted signal at the differential receiver.

SUMMARY OF THE INVENTION

In one embodiment, an integrated circuit package comprises:

a differential pair of two electrical conductors; and an added trace length that extends a shorter one of the two electrical conductors by routing the added trace length entirely inside an area surrounded by a contact pad that electrically terminates the shorter one of the two electrical conductors to compensate for an impedance discontinuity of the shorter one of the two electrical conductors.

In another embodiment, a method of minimizing differential pair length mismatch and impedance discontinuities in an integrated circuit design includes steps of:

(a) receiving as input at least a portion of an integrated circuit design including a differential pair of two electrical conductors;

(b) calculating a value of length mismatch between the two electrical conductors;

(c) calculating an added trace length to compensate for an impedance discontinuity of a shorter one of the two electrical conductors;

(d) extending the shorter one of the two electrical conductors by routing the added trace length entirely inside an area surrounded by a contact pad that electrically terminates the shorter one of the two electrical conductors; and (e) generating as output the routing for the differential pair with the added trace length in the integrated circuit design.

In a further embodiment, a computer program product includes:

a medium for embodying a computer program for input to a computer; and a computer program embodied in the medium for causing the computer to perform steps of:

(a) receiving as input at least a portion of an integrated circuit design including a differential pair of two electrical conductors;

(b) calculating a value of length mismatch between the two electrical conductors;

(c) calculating an added trace length to compensate for an impedance discontinuity of a shorter one of the two electrical conductors;

(d) extending the shorter one of the two electrical conductors by routing the added trace length entirely inside an area surrounded by a contact pad that electrically terminates the shorter one of the two electrical conductors; and (e) generating as output the routing for the differential pair with the added trace length in the integrated circuit design.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the following drawings:

FIG. 9 illustrates an exemplary table of self inductance values and corresponding added trace lengths for the integrated circuit package of FIG. 5.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

In integrated circuit package design, signals may be transmitted in the integrated circuit package over differential pairs. A differential pair includes two electrically conductive traces routed generally parallel to each other. Each of the two traces is driven by a signal having the same waveform but opposite polarity, so that the sum of the two signals is always zero.

Figure 1:
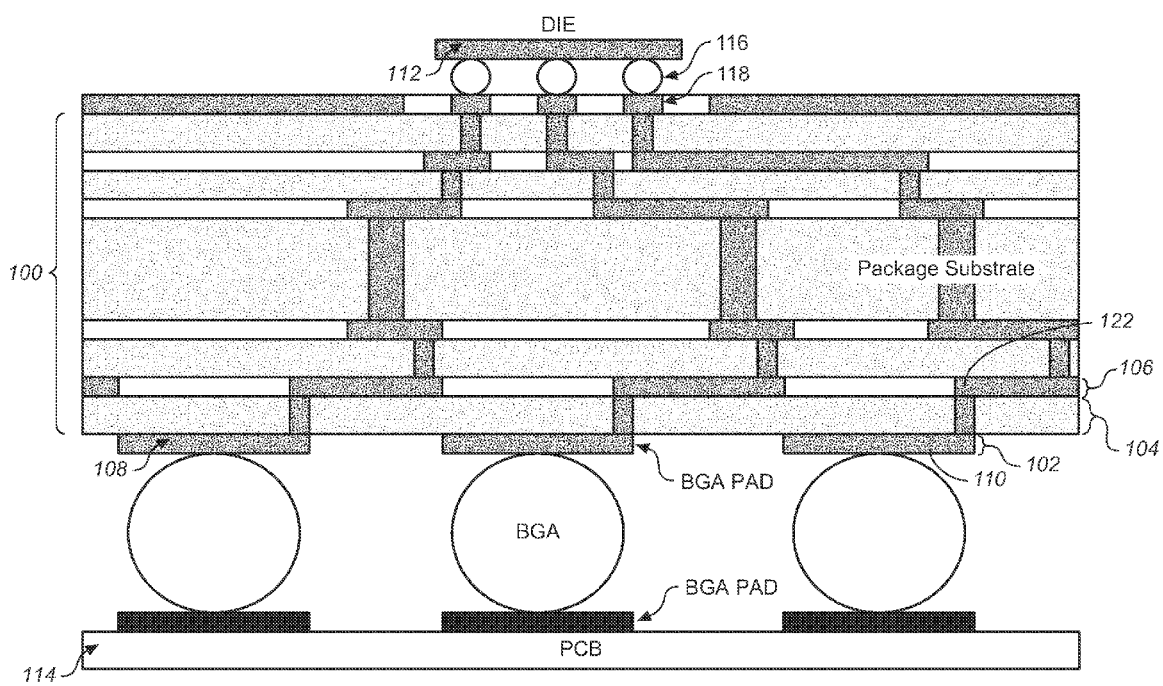
FIG. 1 illustrates a partial side view of a typical ball grid array integrated circuit package of the prior art.

FIG. 1 illustrates a partial side view of a typical ball grid array integrated circuit package 100 of the prior art. Shown in FIG. 1 are a contact pad layer 102, an insulating layer 104, a routing layer 106, a ball pad 108, a via 110, an integrated circuit die 112, a printed circuit board 114, die bumps 116, bump pads 118, and differential pair conductors 122.

In FIG. 1, the contact pad layer 102 and the routing layer 106 are typically electrically conductive metal layers made of, for example, copper or copper alloy. The insulating layer 104 is typically made of a dielectric material, such as an epoxy compound. The contact pad layer 102 is used to make electrical connections between the integrated circuit die 112 and the integrated circuit package 100. The ball pad 108 is formed in the contact pad layer 102 for making electrical connection with the integrated circuit die 112. The metal area of the ball pad 108 in conjunction with the printed circuit board 114 may produce a significant capacitive reactance, as will be described further below.

The via 110 is a hole formed in the insulating layer 104 and filled with an electrically conductive material, for example, copper or copper alloy. The via 110 is used to make electrical connection between the ball pad 108 formed in the contact pad layer 102 and one of the conductors of the differential pair formed in the routing layer 106. Typically, several metal layers separated by insulating layers are used to connect the die 112 to the contact pads 108 in an integrated circuit package. For example, there may be several routing layers and several voltage supply and ground return metal layers.

Figure 2:
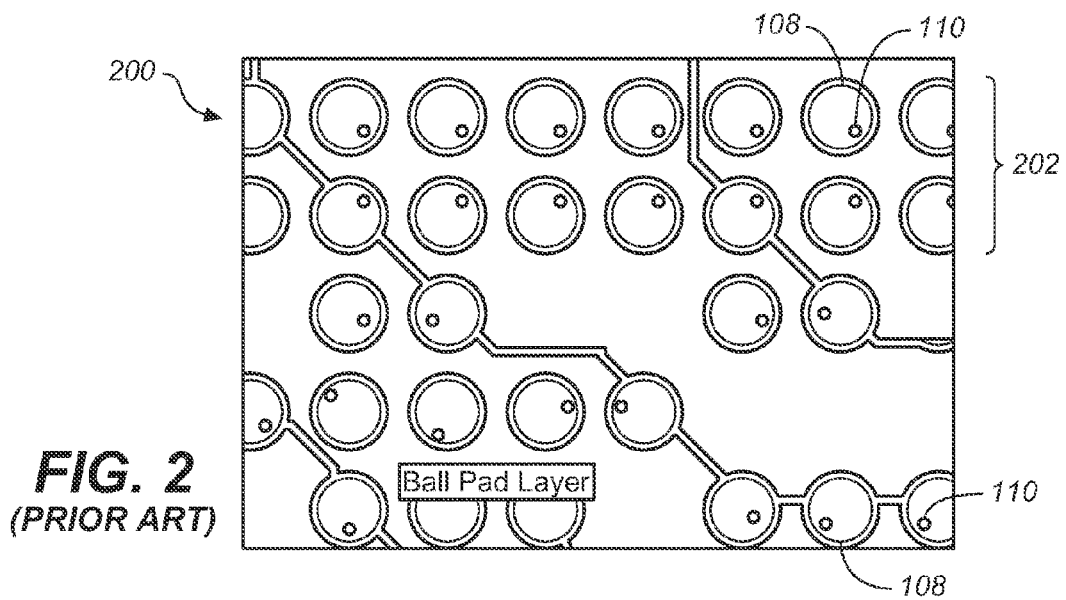
FIG. 2 illustrates a top view of the contact pad layer in the integrated circuit package of FIG. 1.

FIG. 2 illustrates a top view 200 of the contact pad layer 102 in the integrated circuit package 100 of FIG. 1. Shown in FIG. 2 are ball pads 108, vias 110, and a differential pair row 202.

In FIG. 2, the ball pads 108 in the differential pair row 202 are used to connect the integrated circuit package 100 to the integrated circuit die 112 in FIG. 1. The vias 110 are located inside the area surrounded by the ball pads 108.

Figure 3:
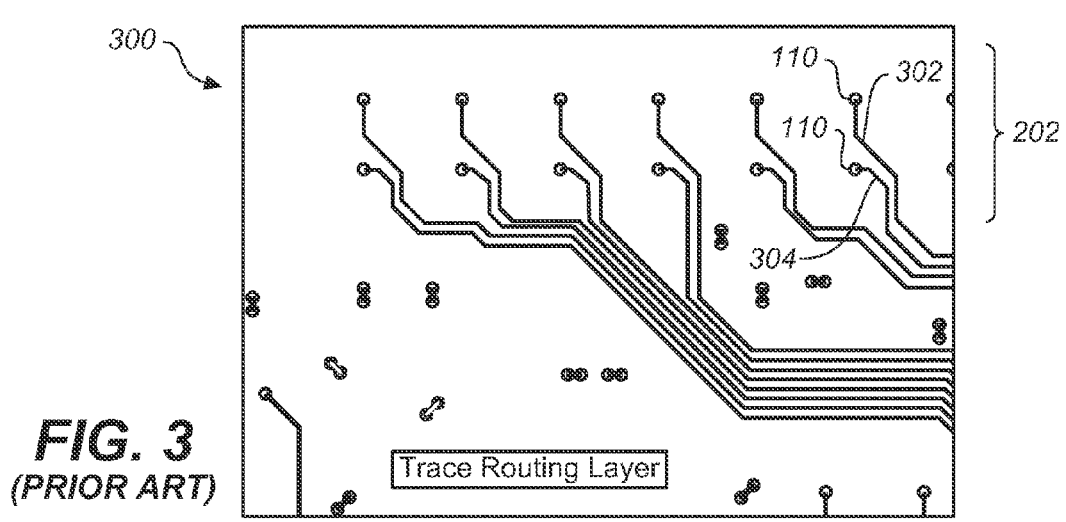
FIG. 3 FIG. 3 illustrates a top view of the routing metal layer in the integrated circuit package of FIG. 1.

FIG. 3 illustrates a top view 300 of the routing metal layer 106 in the integrated circuit package 100 of FIG. 1. Shown in FIG. 3 are vias 110, a differential pair row 202, and differential pair conductors 302 and 304.

In FIG. 3, each of the differential pair conductors 302 and 304 is terminated by one of the vias 110. In this example, the routing of the differential pair conductors 302 and 304 results in a length mismatch or skew of about 700 microns.

Figure 4:
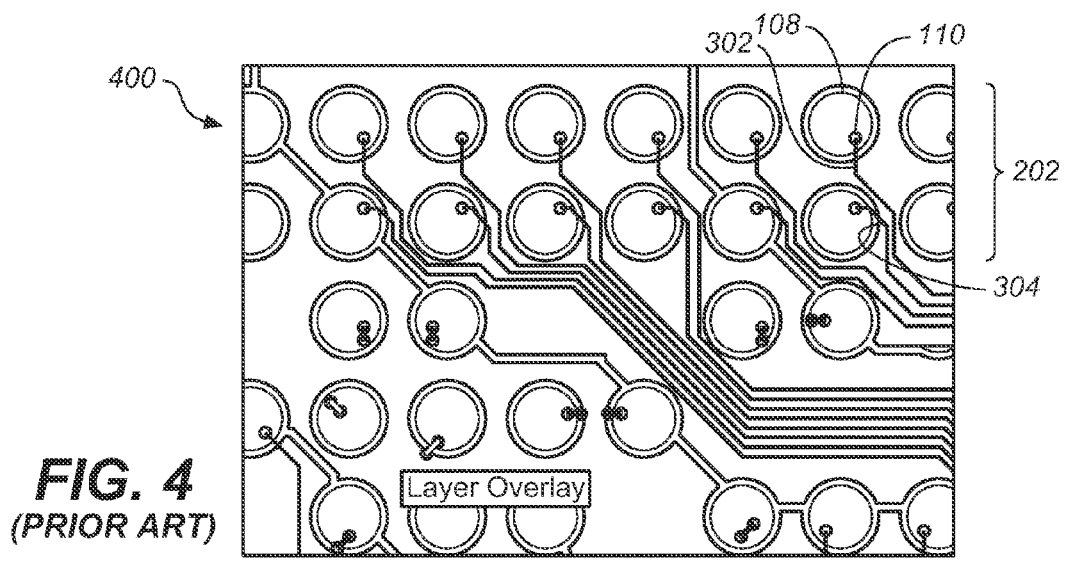
FIG. 4 illustrates a top view of FIG. 2 overlaid on the contact pad layer of FIG. 3.

FIG. 4 illustrates a top view 400 of FIG. 2 overlaid on the contact pad layer of FIG. 3. Shown in FIG. 3 are ball pads 108, vias 110, a differential pair row 202, and differential pair conductors 302 and 304.

In FIG. 4, the connections between the ball pads 108 and the differential pair conductors 302 and 304 in the differential pair row 202 by the vias 110 may be more clearly seen. The length mismatch between each pair of the differential pair conductors 302 and 304 may result in significant relative phase shift of the signal transmitted to or from the ball pads 108 through the differential pair conductors 302 and 304. Also, the shorter differential pair conductors 304 are typically mismatched in impedance with the longer differential pair conductors 302. The shorter length of the differential pair conductors 304 generally results in less inductive reactance than that of the longer differential pair conductors 302. The resulting impedance discontinuity may result in asymmetrical distortion of the signal transmitted to or from the ball pads 108 through the differential pair conductors 302 and 304.

In some methods used in the prior art to correct length mismatch between the differential pair conductors 302 and 304, an extra trace length is added in the routing of the shorter differential pair conductors 304 before reaching the ball pads 108. While these methods may correct the length mismatch, they do not address the problem of impedance discontinuity in the routing path described above. As a result, the symmetry of the signals driving the differential pair conductors 302 and 304 may be degraded at the ball pads 108. A device for correcting both the length mismatch and the impedance discontinuity between the differential pair conductors 302 and 304 is described as follows.

In one embodiment, an integrated circuit package comprises:

a differential pair of two electrical conductors; and an added trace length that extends a shorter one of the two electrical conductors by routing the added trace length entirely inside an area surrounded by a contact pad that electrically terminates the shorter one of the two electrical conductors to compensate for an impedance discontinuity of the shorter one of the two electrical conductors.

Figure 5:
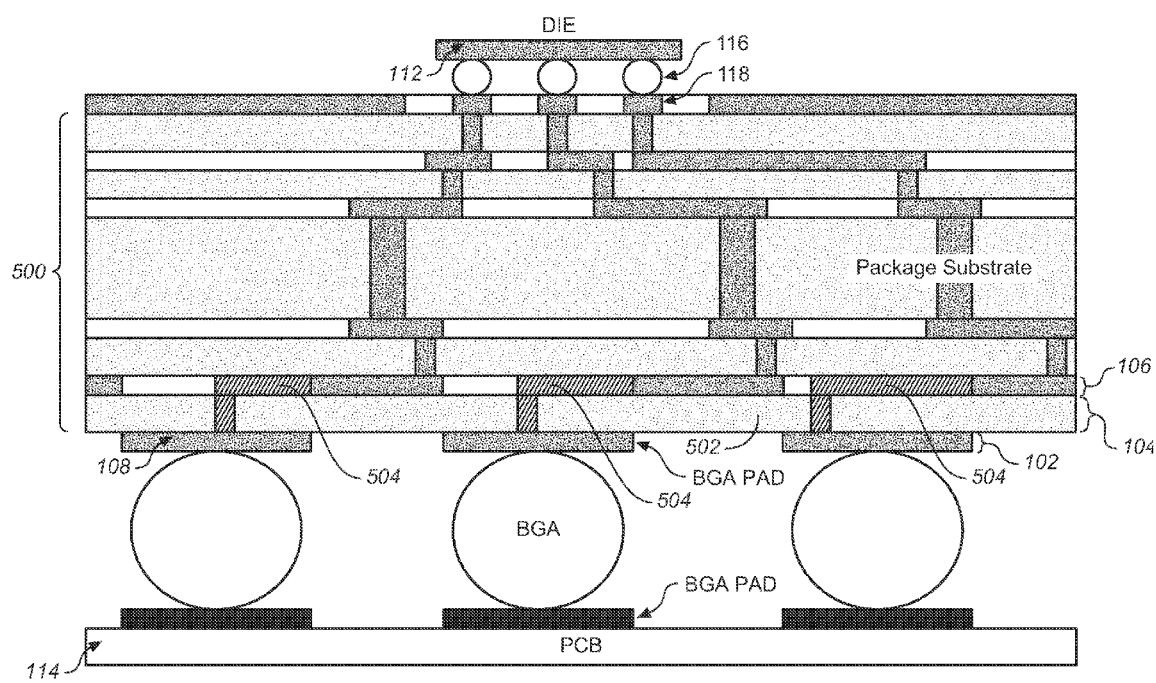
FIG. 5 illustrates a partial side view of an integrated circuit package that compensates for impedance discontinuities and length mismatch in differential pair conductors.

FIG. 5 illustrates a partial side view 500 of an integrated circuit package 500 that compensates for impedance discontinuities and length mismatch in differential pair conductors. Shown in FIG. 5 are a contact pad layer 102, an insulating layer 104, a routing layer 106, a ball pad 108, an integrated circuit die 112, a printed circuit board 114, die bumps 116, bump pads 118, differential pair conductors 122, vias 502, and added trace lengths 504.

The structure of the integrated circuit package 500 in FIG. 5 may be the same as that of FIG. 1, except for the added trace lengths 504 that extend the shorter one of the differential pair conductors 122.

Figure 6:
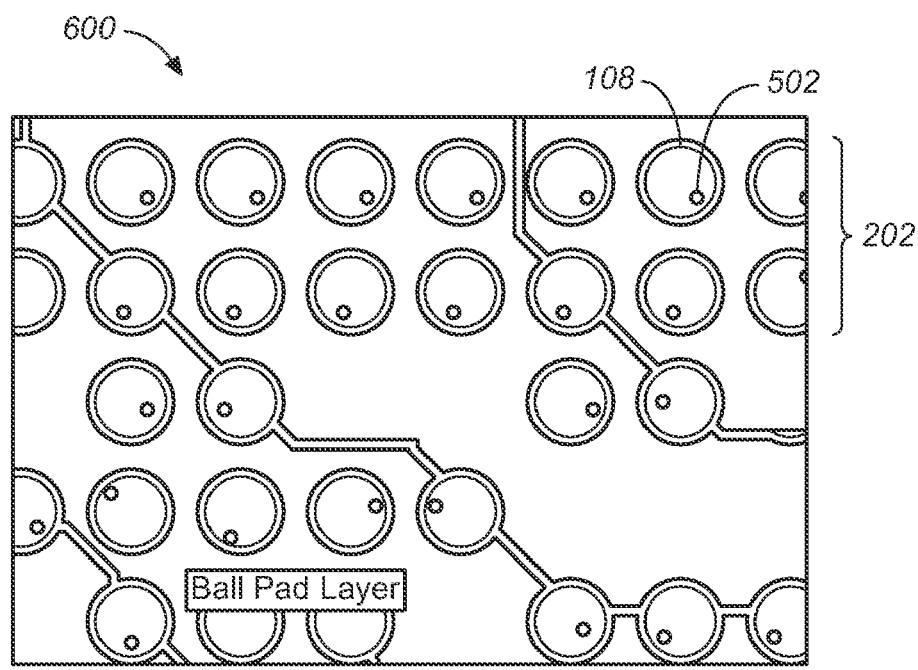
FIG. 6 illustrates a top view of a contact pad layer for the integrated circuit package of FIG. 5.

FIG. 6 illustrates a top view 600 of a contact pad layer for the integrated circuit package of FIG. 5. Shown in FIG. 6 are ball pads 108, a differential pair row 202, and vias 502.

In FIG. 6, the ball pads 108, the vias 502, and the differential pair row 202 may be, for example, the same as those in FIG. 2, except that the placement of the vias 502 is changed to move the termination point of the shorter differential conductors that are electrically terminated by the ball pads 108.

Figure 7:
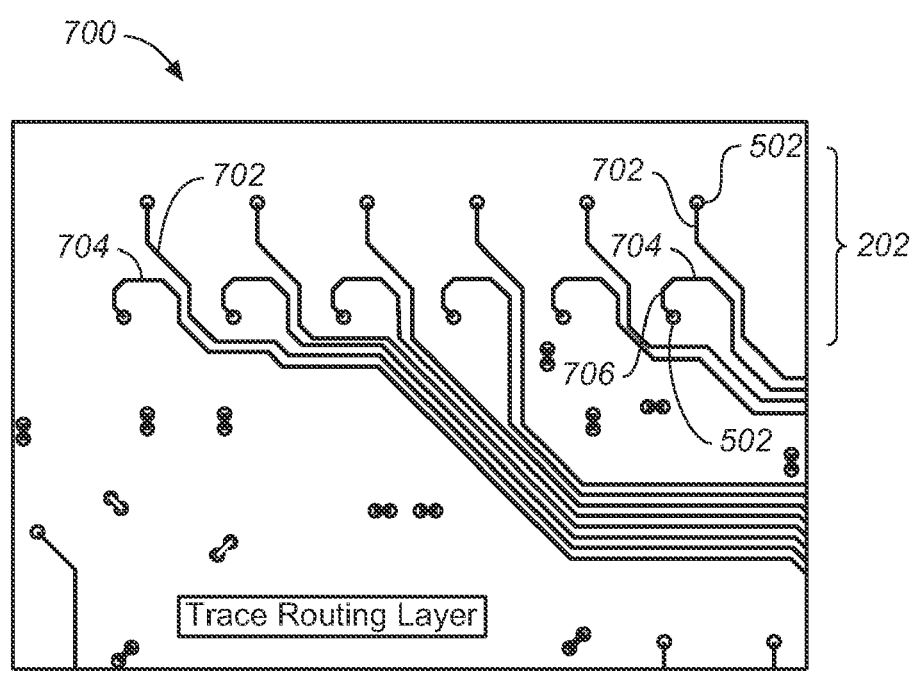
FIG. 7 illustrates a top view of the routing metal layer for the integrated circuit package of FIG. 5.

FIG. 7 illustrates a top view 700 of the routing metal layer 106 for the integrated circuit package of FIG. 5. Shown in FIG. 7 are a differential pair row 202, vias 502, differential pair conductors 702 and 704, and added trace lengths 706.

In FIG. 7, each of the differential pair conductors 702 and 704 is terminated by one of the vias 502. The routing of the differential pair conductors 702 and 704 that resulted in a length mismatch or skew of about 700 microns in the routing example of FIG. 3 has been corrected by moving the vias 502 to extend the length of the shorter differential pair conductors 704 by the added trace lengths 706.

Figure 8:
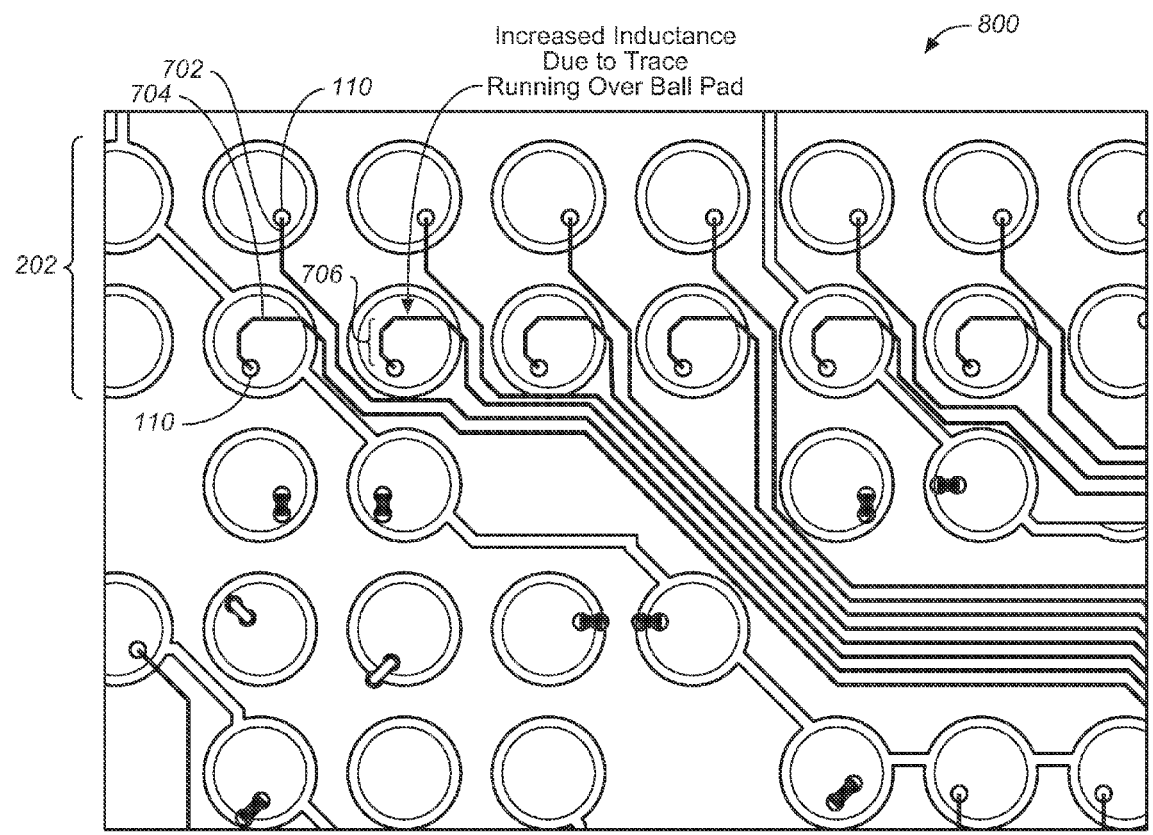
FIG. 8 illustrates a top view of FIG. 7 overlaid on the contact pad layer of FIG. 6.

FIG. 8 illustrates a top view 800 of FIG. 6 overlaid on the contact pad layer of FIG. 7. Shown in FIG. 6 are ball pads 108, a differential pair row 202, vias 502, differential pair conductors 702 and 704, and added trace lengths 706.

In FIG. 8, the connections between the ball pads 108 and the differential pair conductors 702 and 704 in the differential pair row 202 by the vias 502 may be more clearly seen. The length mismatch between each pair of the differential pair conductors 702 and 704 has been corrected to about a 100 micron offset for capacitive coupling by moving the each of the vias 502 away from the termination of the shorter differential pair conductors 704 and extending the shorter differential pair conductors 704 by the added trace lengths 706 that connect the shorter differential pair conductors 704 to the relocated vias 502.

In contrast to adding a trace length in the routing area outside the ball pad to match trace length as in previous methods, each added trace length 706 is routed entirely inside the area of the routing layer 106 that is surrounded by the contact pad 108. As a result, each ball pad 108 shields the added trace length 706 from the printed circuit board 114 in FIG. 5. The capacitive reactance of the added trace length 706 is dominated by the constant capacitive reactance between the ball pad 108 and the printed circuit board 114, while the inductive reactance increases substantially according to the formula $$Z=(L/C)^{1/2} \quad (1)$$

where Z is the impedance of the added trace length, L is the inductance of the added trace length 706, and C is the capacitance between the corresponding ball pad 108 and the printed circuit board 114.

FIG. 9 illustrates an exemplary table 900 of self inductance values and corresponding added trace lengths for the integrated circuit package of FIG. 5. The table of FIG. 9 may be created for an integrated circuit package design according to well known techniques, for example, by a field solver used in electrical simulation software. In the example of FIG. 9, the ball pad capacitance C has a value of 0.27 pf. The table of FIG. 9 may be used to compare self inductance values for different added trace lengths with the capacitance of the ball pad. The added trace length calculated to correct the length mismatch may be adjusted according to the table of FIG. 9 to select the added trace length that reduces the impedance discontinuity to maximize signal symmetry for each differential pair. Signal symmetry is a measure of how closely the waveforms of a signal driving each of the two electrical conductors in a differential pair are identical opposites of each other in both amplitude and phase at the termination of the differential pair at the contact pads.

In another embodiment, the ball pad capacitance is calculated according to well-known techniques. The added trace length for providing the inductance needed to compensate for the ball pad capacitance is selected from a table, for example, the table of FIG. 9. The remainder of the length mismatch between the differential pair conductors is made up by adding trace length in a region outside the ball pad according to well-known routing techniques. For example, for a length mismatch of 500 microns between conductors of a differential pair, it is calculated that an added trace length of 300 microns will compensate for the impedance discontinuity. The added trace length of 300 microns is routed over the ball pad. The remaining 200 microns is routed outside the ball pad to match the length of the longer conductor of the differential pair according to well-known routing techniques.

In another embodiment, a method of minimizing differential pair length mismatch and impedance discontinuities in an integrated circuit package design includes steps of:

(a) receiving as input at least a portion of an integrated circuit design including a differential pair of two electrical conductors;

(b) calculating a value of length mismatch between the two electrical conductors;

(c) calculating an added trace length to compensate for an impedance discontinuity of a shorter one of the two electrical conductors;

(d) extending the shorter one of the two electrical conductors by routing the added trace length entirely inside an area surrounded by a contact pad that electrically terminates the shorter one of the two electrical conductors; and (e) generating as output the routing for the differential pair with the added trace length in the integrated circuit design.

Figure 10:
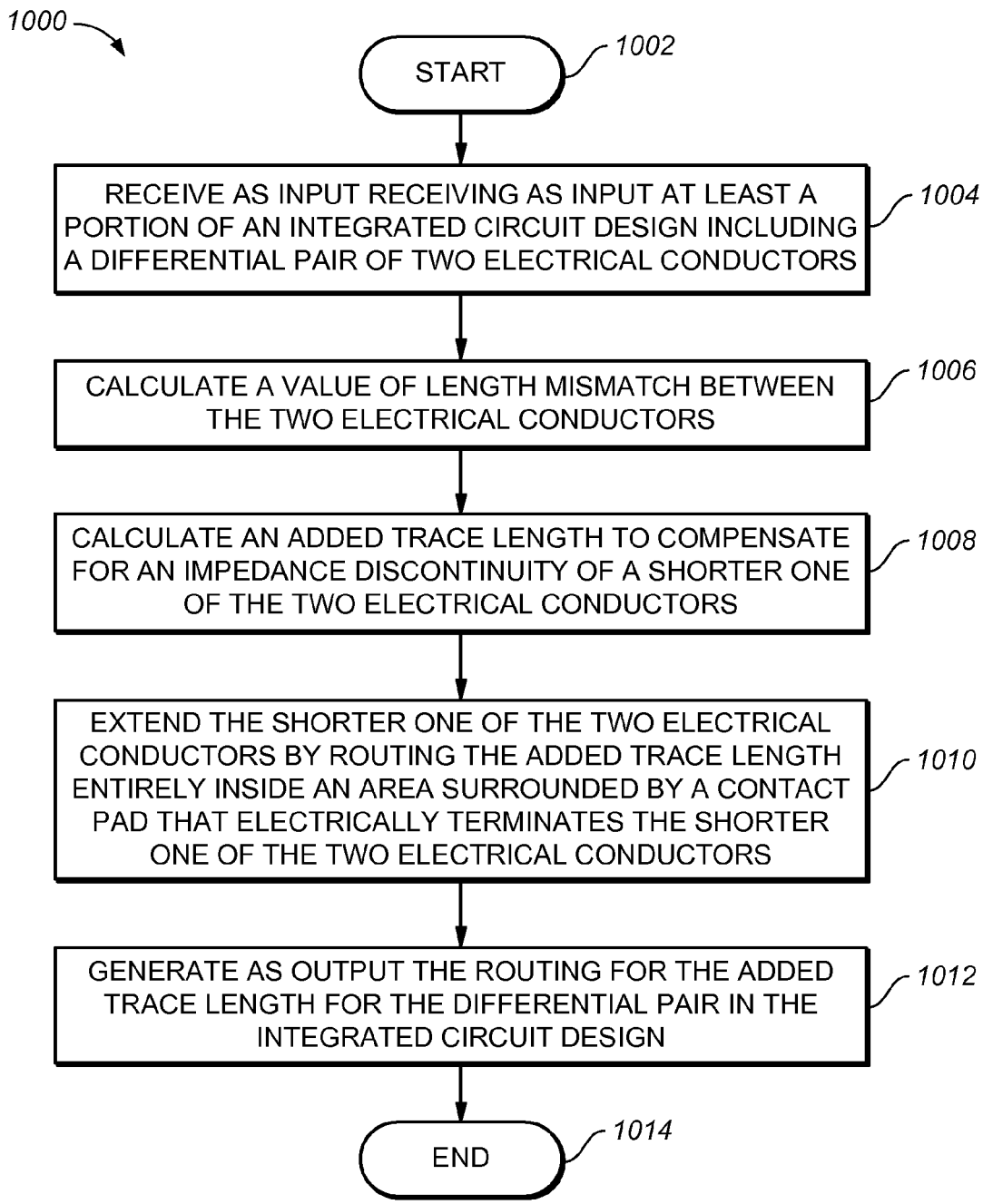
FIG. 10 illustrates a flow chart for a method of minimizing length mismatch and impedance discontinuity in a differential pair for an integrated circuit design.

FIG. 10 illustrates a flow chart 1000 for a method of minimizing length mismatch and impedance discontinuity in a differential pair for an integrated circuit design.

Step 1002 is the entry point of the flow chart 1000.

In step 1004, at least a portion of an integrated circuit design including a differential pair of two electrical conductors is received as input according to well known techniques. The shorter of the two electrical conductors is electrically terminated by a contact pad formed in a contact pad layer that is separated from the routing layer by an insulating layer. The contact pad may be, for example, a ball pad of a ball grid array integrated circuit package.

In step 1006, a value of length mismatch between the two electrical conductors is calculated, for example, according to well known electrical simulation techniques.

In step 1008, an added trace length is calculated to compensate for an impedance discontinuity of a shorter one of the two electrical conductors. In one embodiment, the calculation includes adjusting the calculated value of the added trace length, for example, by selecting the value of added trace length from the table of FIG. 9 so that the inductance of the selected added trace length results in maximum signal symmetry for the differential pair.

In step 1010, the shorter of the two electrical conductors is extended by routing the added trace length entirely inside an area of the routing layer surrounded by the contact pad, for example, according to well known placement and routing techniques used in integrated circuit package design. In one embodiment, the via terminating the shorter of the two electrical conductors is relocated in the insulating layer to accommodate the added trace length.

In step 1012, the added trace length for the differential pair is generated as output in the integrated circuit design. In another embodiment, the remaining trace length needed to compensate for the length mismatch calculated in step 1006 is routed outside the area surrounded by the ball pad according to well-known routing techniques.

Step 1014 is the exit point of the flow chart 1000.

By routing the added trace length entirely inside an area of the routing layer surrounded by the contact pad, length matching of the differential pair is achieved while advantageously avoiding impedance discontinuities, resulting in improved signal integrity compared to previous methods for correcting length mismatch in differential pairs. The method of FIG. 10 may be applied in various embodiments to a variety of integrated circuit package designs, for example, ball grid array integrated circuit packages and wire bond integrated circuit packages. Other circuit designs incorporating differential pairs may also benefit from the method of FIG. 10 to practice various embodiments within the scope of the appended claims.

The flow chart described above with reference to FIG. 10 may also be automated by instructions for a computer. The instructions may be embodied in a disk, a CD-ROM, and other computer readable media according to well known computer programming techniques.

In a further embodiment, a computer program product includes:

a medium for embodying a computer program for input to a computer; and a computer program embodied in the medium for causing the computer to perform steps of:

(a) receiving as input at least a portion of an integrated circuit design including a differential pair of two electrical conductors;

(b) calculating a value of length mismatch between the two electrical conductors;

(c) calculating an added trace length to compensate for an impedance discontinuity of a shorter one of the two electrical conductors;

(d) extending the shorter one of the two electrical conductors by routing the added trace length entirely inside an area surrounded by a contact pad that electrically terminates the shorter one of the two electrical conductors; and (e) generating as output the routing for the differential pair with the added trace length in the integrated circuit design.

Although the flowchart description above is described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. An integrated circuit package comprises:

a differential pair of two electrical conductors; and an added trace length that extends a shorter one of the two electrical conductors by routing the added trace length entirely inside an area surrounded by a contact pad that electrically terminates the shorter one of the two electrical conductors to compensate for an impedance discontinuity of the shorter one of the two electrical conductors.

2. The integrated circuit package of claim 1 further comprising an extension of the added trace length outside the area surrounded by the contact pad to compensate for a length mismatch between the two electrical conductors.

3. The integrated circuit package of claim 1 further comprising an adjustment of the added trace length to result in maximum signal symmetry for the differential pair.

* * * * *